US012610550B2

(12) United States Patent
Do et al.

(10) Patent No.: US 12,610,550 B2
(45) Date of Patent: Apr. 21, 2026

(54) MEMORY DEVICE WITH DEFECT-FREE SLITS

(71) Applicant: SK hynix Inc., Icheon-si (KR)

(72) Inventors: Hong Kyeong Do, Icheon-si (KR); Ki Hong Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 384 days.

(21) Appl. No.: 18/300,997

(22) Filed: Apr. 14, 2023

(65) Prior Publication Data

US 2024/0147721 A1     May 2, 2024

(30) Foreign Application Priority Data

Nov. 2, 2022     (KR) .......................... 10-2022-0144525

(51) Int. Cl.
 *H10B 43/27* (2023.01)
(52) U.S. Cl.
 CPC .................................... *H10B 43/27* (2023.02)
(58) Field of Classification Search
 CPC ........ H10B 53/00; H10B 53/10; H10B 53/20;
 H10B 53/30; H10B 53/40; H10B 53/50;
 H10B 41/00; H10B 41/10; H10B 41/20;
 H10B 41/23; H10B 41/27; H10B 41/30;
 H10B 41/35; H10B 41/40–44; H10B
 41/46–50; H10B 41/60; H10B 41/70;
 H10B 43/00; H10B 43/10; H10B 43/20;
 H10B 43/23; H10B 43/27; H10B 43/30;

H10B 43/35; H10B 43/40; H10B 43/50;
H10B 51/00; H10B 51/10; H10B 51/20;
H10B 51/30; H10B 51/40; H10B 51/50
See application file for complete search history.

(56) References Cited

U.S. PATENT DOCUMENTS

| | | | | |
|---|---|---|---|---|
| 11,069,698 B2 * | 7/2021 | Kim | .................... | H10B 43/10 |
| 2015/0371993 A1 * | 12/2015 | Jung | .................... | H10B 41/27 |
| | | | | 257/773 |
| 2017/0323898 A1 * | 11/2017 | Oh | .................... | H10B 43/27 |
| 2020/0020712 A1 * | 1/2020 | Kim | .................... | H10B 43/40 |

FOREIGN PATENT DOCUMENTS

| | | |
|---|---|---|
| KR | 1020120092483 A | 8/2012 |
| KR | 102128465 B1 | 7/2020 |

* cited by examiner

*Primary Examiner* — William B Partridge
*Assistant Examiner* — Gustavo G Ramallo
(74) *Attorney, Agent, or Firm* — WILLIAM PARK AND ASSOCIATES LTD.

(57) ABSTRACT

A memory device includes adjacent first and second memory blocks, divided by a slit, in which a cell region and a connection region are divided in a direction perpendicular to the adjacent direction. The slit has a first width between the cell region of the first memory block and the cell region of the second memory block, has the first width between the connection region of the first memory block and the connection region of the second memory block, and has a second width wider than the first width in a region where the cell region and the connection region of the first memory block are adjacent to each other and the cell region and the connection region of the second memory block are adjacent to each other.

9 Claims, 18 Drawing Sheets

MEMORY DEVICE WITH DEFECT-FREE SLITS

CROSS-REFERENCE TO RELATED APPLICATION

The present application claims priority under 35 U.S.C. § 119(a) to Korean patent application number 10-2022-0144525, filed on Nov. 2, 2022, in the Korean Intellectual Property Office, the entire disclosure of which is incorporated herein by reference.

BACKGROUND

1. Technical Field

The present disclosure relates to a memory device and a method of manufacturing the same, and more particularly, to a memory device including a slit and a method of manufacturing the same.

2. Related Art

A memory device may include a memory cell array in which data is stored, a peripheral circuit configured to perform a program, read, or erase operation, and control logic configured to control the peripheral circuit.

The memory cell array may include a plurality of memory blocks, and each of the plurality of memory blocks may include a plurality of memory cells. A memory device having a three-dimensional structure may include memory cells stacked on a substrate. For example, in the memory device having the three-dimensional structure, memory blocks may include a plurality of strings extending in a vertical direction from the substrate, and each of the plurality of strings may include a plurality of memory cells.

Memory blocks may be separated from each other by a slit. The slit may be a trench dividing stack layers in a line shape. As a storage capacity of the memory device increases, a height of stack layers increases. In addition, a density difference of structures included in the stack layers may occur. Because an etching process is performed in a plasma environment, as the height and the density difference of the structure to be etched increases, a charge potential difference may occur, and thus a defect may occur in the slit.

SUMMARY

Some embodiments of the present disclosure are directed to a memory device capable of preventing a defect from occurring in a slit and a method of manufacturing the memory device.

According to an embodiment of the present disclosure, a memory device includes a first memory block in which a cell region and a connection region are divided in a first direction. The memory device also includes a second memory block in which the cell region and the connection region are divided in the first direction, the second memory block being adjacent to the first memory block in a second direction perpendicular to the first direction. The memory device further includes a slit between the first and second memory blocks dividing the second memory block from the first memory block. The slit has a first width between the cell region of the first memory block and the cell region of the second memory block, has the first width between the connection region of the first memory block and the connection region of the second memory block, and has a second width wider than the first width in a region where the cell region and the connection region of the first memory block are adjacent to each other and the cell region and the connection region of the second memory block are adjacent to each other.

According to the present disclosure, a method of manufacturing a memory device includes forming a first stack structure on a lower structure in which a cell region and a connection region adjacent to each other are divided, forming first cell plugs and protective patterns in the first stack structure, forming a second stack structure on the first stack structure, forming second cell plugs in the second stack structure, forming a slit dividing the second and first stack structures into a first memory block and a second memory block, and exposing the protective patterns, and removing the protective patterns.

In some embodiments, the present technology may reduce an electrical characteristic difference of memory blocks divided by the slit by preventing a defect from occurring in the slit.

BRIEF DESCRIPTION OF THE DRAWINGS

FIGS. 6A to 6J are diagrams illustrating a method of manufacturing the memory device according to the first embodiment of the present disclosure.

FIG. 9 is a layout illustrating a structure of a memory device according to a fourth embodiment of the present disclosure.

DETAILED DESCRIPTION

Specific structural or functional descriptions disclosed below are exemplified to describe an embodiment according to the concept of the present disclosure. The embodiment according to the concept of the present disclosure is not construed as being limited to the embodiments described below and may be variously modified and replaced with other equivalent embodiments.

Hereinafter, terms such as first and second may be used to describe various components, but the components are not limited by the terms. The terms are used for the purpose of distinguishing one component from another component and not to imply a number or order of components.

Figure 1:
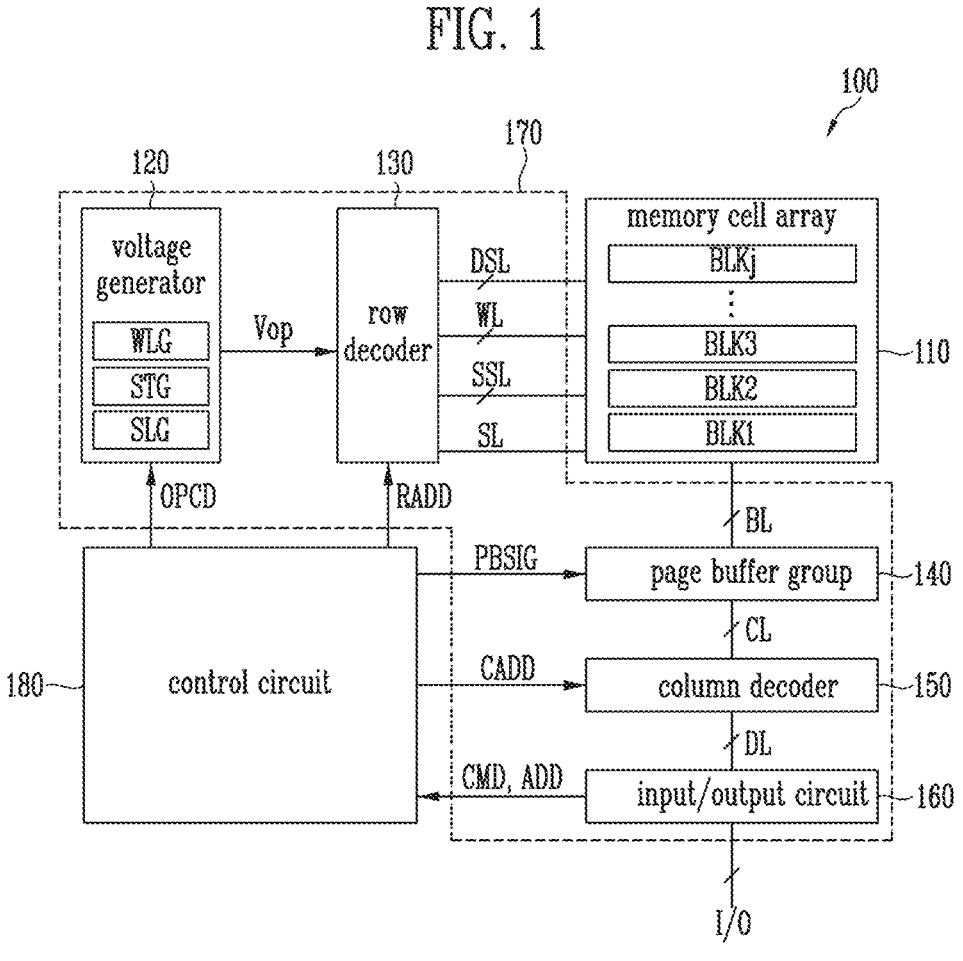
FIG. 1 is a diagram illustrating a memory device.

FIG. 1 is a diagram illustrating a memory device.

Referring to FIG. 1, the memory device 100 may include a memory cell array 110, a peripheral circuit 170, and a control circuit 180.

The memory cell array 110 may include first to j-th memory blocks BLK1 to BLKj. Each of the first to j-th memory blocks BLK1 to BLKj may include memory cells. The memory blocks may be formed in a three-dimensional structure. The memory blocks having the three-dimensional structure may include memory cells vertically stacked from a substrate. Drain select lines DSL, word lines WL, and source select lines SSL may be connected to each of the first to j-th memory blocks BLK1 to BLKj, and bit lines BL may be commonly connected to each of the first to j-th memory blocks BLK1 to BLKj.

The memory cells may store 1 bit or 2 bits or more of data according to a program method. For example, a method in which 1 bit of data is stored in one memory cell is referred to as a single-level cell method, and a method in which 2 bits of data is stored in one memory cell is referred to as a multi-level cell method. A method in which 3 bits of data is stored in one memory cell is referred to as a triple-level cell method, and a method in which 4 bits of data is stored in one memory cell is referred to as a quad-level cell method. In addition to this, five bits or more of data may be stored in one memory cell.

The peripheral circuit 170 may be configured to perform a program operation of storing data in the memory cell array 110, a read operation of outputting the data stored in the memory cell array 110, and an erase operation of erasing the data stored in the memory cell array 110. For example, the peripheral circuit 170 may include a voltage generator 120, a row decoder 130, a page buffer group 140, a column decoder 150, and an input/output circuit 160.

The voltage generator 120 may generate various operation voltages Vop used for the program operation, the read operation, or the erase operation in response to an operation code OPCD. For example, the voltage generator 120 may be configured to generate a program voltage, a pass voltage, a turn on voltage, a turn off voltage, a ground voltage, a negative voltage, a source voltage, a verify voltage, a read voltage, an erase voltage, a precharge voltage, and the like in response to the operation code OPCD. The program voltage may be a voltage applied to a selected word line among the word lines WL during the program operation, and may be used to increase a threshold voltage of memory cells connected to the selected word line. The pass voltage may be a voltage applied to unselected word lines among the word lines WL during the program or read operation, and may be used to turn on memory cells connected to the unselected word lines. The turn on voltage may be a voltage applied to the drain select line DSL or the source select line SSL, and may be used to turn on a drain select transistor or a source select transistor. The turn off voltage may be a voltage applied to the drain select line DSL or the source select line SSL and may be used to turn off the drain select transistor or the source select transistor. The ground voltage may be a 0V voltage. The negative voltage may be a voltage lower than 0V. The source voltage may be a voltage applied to a source line SL, and may be a negative voltage, a ground voltage, or a positive voltage. The verify voltage may be a voltage for determining a threshold voltage of selected memory cells during the program or erase operation and may be applied to the selected word line or all word lines connected to a selected memory block. The read voltage may be a voltage applied to the selected word line during the read operation and may be used to determine the data stored in the memory cells. The erase voltage may be a voltage applied to the source line SL during the erase operation and may be used to decrease the threshold voltage of the memory cells. The precharge voltage may be a positive voltage for precharging a channel of unselected strings during the program operation, and may be supplied to the source line SL.

The row decoder 130 may be connected to the voltage generator 120 through global lines, and may be connected to the first to j-th memory blocks BLK1 to BLKj through the drain select lines DSL, the word lines WL, the source select lines SSL, and the source line SL. For example, the row decoder 130 may be configured to transmit the operation voltages Vop to the drain select lines DSL, the word lines WL, the source select lines SSL, and the source line SL connected to the selected memory block according to a row address RADD.

The page buffer group 140 may include page buffers (not shown) respectively connected to the bit lines BL. Each of the page buffers (not shown) may be connected to the memory blocks through the bit lines BL. The page buffers (not shown) may adjust a level of a voltage applied to the bit lines BL and a time when the voltage is applied to the bit lines BL in response to page buffer control signals PBSIG, and may store data read from the memory cells by sensing a current or a voltage of the bit lines BL. During the program operation, the page buffers (not shown) may apply a program allowable voltage, a program inhibition voltage, or a precharge voltage to the bit lines BL. The program allowable voltage may be set to 0V or a negative voltage. The program inhibition voltage may be set to a positive voltage.

The column decoder 150 may be configured to transmit data between the page buffer group 140 and the input/output circuit 160 in response to a column address CADD. For example, the column decoder 150 may be connected to the page buffer group 140 through column lines CL and may be connected to the input/output circuit 160 through data lines DL.

The input/output circuit 160 may be configured to receive or output a command CMD, an address ADD, or data through input/output lines I/O. For example, the input/output circuit 160 may transmit the command CMD and the address ADD received from an external controller through the input/output lines I/O to the control circuit 180 through the input/output lines I/O, and transmit the data received from the external controller to the column decoder 150 through the input/output lines I/O. Alternatively, the input/output circuit 160 may output the data received from the column decoder 150 to the external controller through the data lines DL.

The control circuit 180 may output the operation code OPCD, the row address RADD, the page buffer control signals PBSIG, and the column address CADD in response to the command CMD and the address ADD. For example, when the command CMD input to the control circuit 180 is a command corresponding to the program operation, the control circuit 180 may control the peripheral circuit 170 to perform the program operation of the memory block selected by the address ADD. When the command CMD input to the control circuit 180 is a command corresponding to the read operation, the control circuit 180 may control the peripheral circuit 170 to perform the read operation of the memory block selected by the address and output the read data. When the command CMD input to the control circuit 180 is a command corresponding to the erase operation, the control circuit 180 may control the peripheral circuit 170 to perform the erase operation of the selected memory block.

Figure 2:
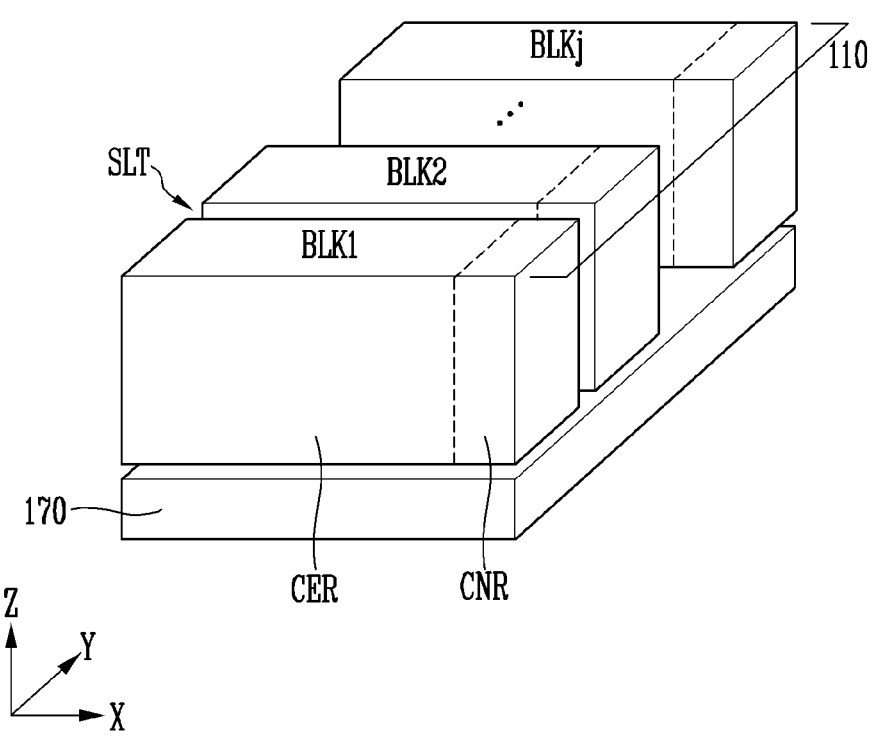
FIG. 2 is a diagram illustrating a disposition relationship between memory blocks and a peripheral circuit.

FIG. 2 is a diagram illustrating a disposition relationship between the memory blocks and the peripheral circuit.

Referring to FIG. 2, the memory cell array may include the first to j-th memory blocks BLK1 to BLKj. The first to j-th memory blocks BLK1 to BLKj may be stacked on the peripheral circuit 170. For example, the peripheral circuit 170 may be disposed on a substrate, and the first to j-th memory blocks BLK1 to BLKj may be disposed on the peripheral circuit 170. That is, the peripheral circuit 170 may be disposed between the first to j-th memory blocks BLK1 to BLKj and the substrate.

Because the first to j-th memory blocks BLK1 to BLKj and the peripheral circuit 170 are disposed in a direction perpendicular to each other, each of the first to j-th memory blocks BLK1 to BLKj may include a cell region CER and a connection region CNR. The memory cells may be included in the cell region CER, and contacts connected to the peripheral circuit 170 may be included in the connection region CNR.

Figure 3:
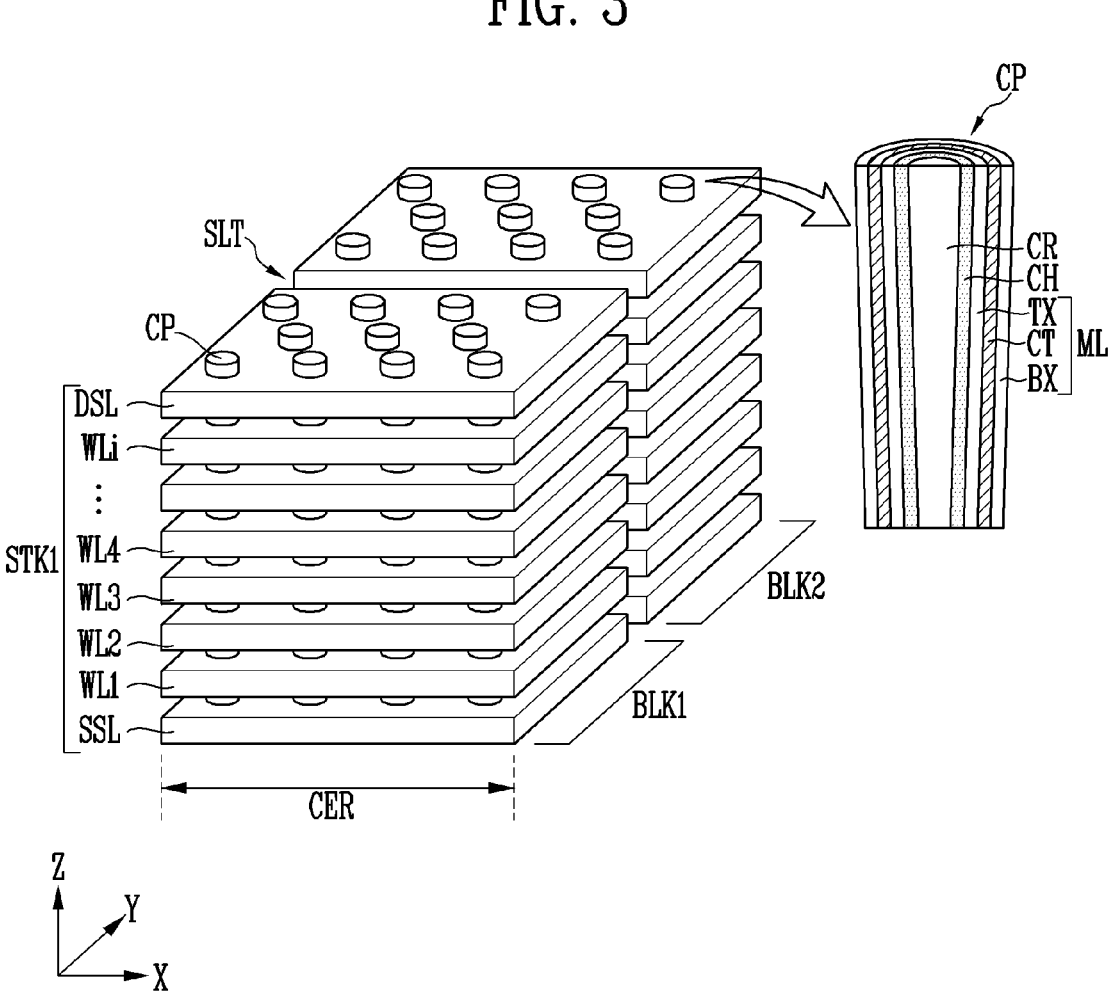
FIG. 3 is a diagram illustrating a structure of a memory block.

FIG. 3 is a diagram illustrating a structure of the memory block.

Referring to FIG. 3, first and second memory blocks BLK1 and BLK2 disposed in a Y direction are shown as an example. Because the first and second memory blocks BLK1 and BLK2 are configured identically to each other, the structure of the first memory block BLK1 is described below.

The first memory block BLK1 may include a first stack structure STK1 including a source select line SSL, first to i-th word lines WL1 to WLi, and a drain select line DSL stacked on a lower structure (not shown) in a vertical direction, and cell plugs CP vertically passing through the first stack structure STK1. The lower structure (not shown) may be the substrate, the peripheral circuit, or the source line. The cell plugs CP may be formed in the cell region CER.

Each of the cell plugs CP may include a memory layer ML, a channel layer CH, and a core pillar CR. The memory layer ML may include a blocking layer BX, a charge trap layer CT, and a tunnel insulating layer (or a tunnel isolation layer) TX.

The blocking layer BX may be formed in a cylindrical shape passing through the first stack structure STK1 and may be formed of an oxide layer or a silicon oxide layer. The charge trap layer CT may be formed in a cylindrical shape along an inner wall of the blocking layer BX and may be formed of a nitride layer. The tunnel insulating layer TX may be formed in a cylindrical shape along an inner wall of the charge trap layer CT and may be formed of an oxide layer or a silicon oxide layer. The channel layer CH may be formed in a cylindrical shape along an inner wall of the tunnel insulating layer TX and may be formed of conductive polysilicon. The core pillar CR may be formed in a cylindrical shape filling an inside of the channel layer CH and may be formed of an insulating material such as an oxide layer or a silicon oxide layer. The memory layer ML adjacent to the first to i-th word lines WL1 to WLi may be the memory cells, the memory layer ML adjacent to the source select line SSL may be the source select transistor, and the memory layer ML adjacent to the drain select line DSL may be the drain select transistor.

The first and second memory blocks BLK1 and BLK2 may be divided into different blocks by a slit SLT. The slit SLT may be a trench formed in a line shape between the first and second memory blocks BLK1 and BLK2. The source select line SSL, the first to i-th word lines WL1 to WLi, and the drain select line DSL included in the first and second memory blocks BLK1 and BLK2 may be separated from each other by the slit SLT.

Insulating layers may be formed to face each other on a sidewall of the slit SLT, and a source contact may be formed between the insulating layers. For example, when the source line is formed under the first and second memory blocks BLK1 and BLK2, the source contact may be formed inside the slit SLT, and the source contact may be connected to the source line.

Figure 4:
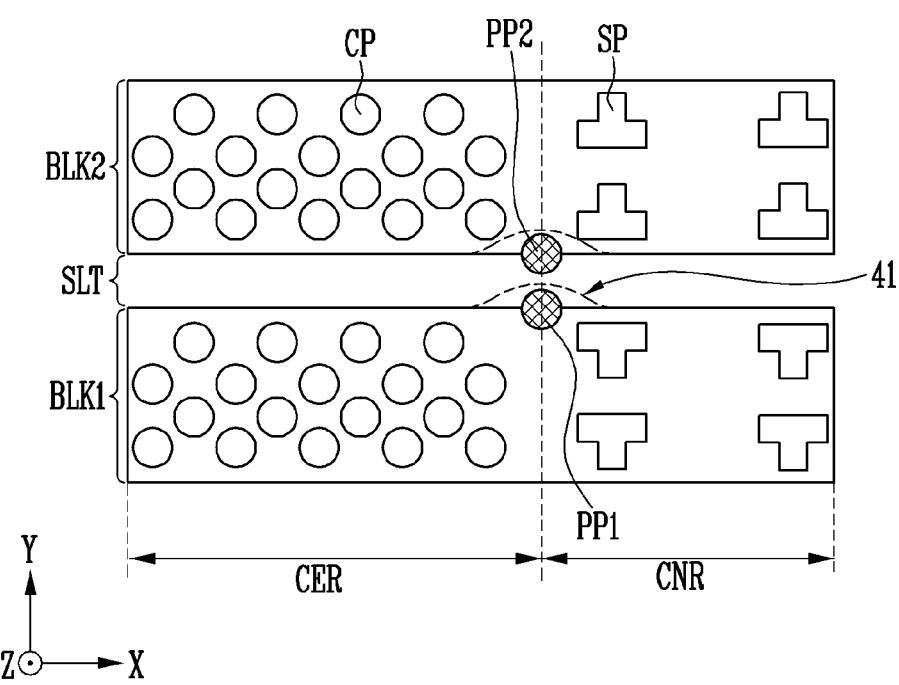
FIG. 4 is a layout illustrating a memory device according to a first embodiment of the present disclosure.

FIG. 4 is a layout illustrating a memory device according to a first embodiment of the present disclosure.

Referring to FIG. 4, the cell plugs CP may be included in the cell region CER of each of the first and second memory blocks BLK1 and BLK2, and support patterns SP for preventing a stack structure from being tilted are formed in the connection region CNR. The support patterns SP may be formed of an insulating material or a conductive material, and may vertically pass through the stack structure identically to the cell plugs CP.

The cell plugs CP may include a conductive material, and the support patterns SP may also be formed of a conductive material. Because the memory cells configured to store data are included in the cell region CER, but the patterns supporting the stack structure are formed in the connection region CNR, a density of the cell plugs CP included in the cell region CER may be higher than a density of the support patterns SP included in the region CNR.

An etching process for forming the slit SLT may be performed as a dry etching process. Because the dry etching process may be performed in a plasma environment, an etching pattern may be deformed in a portion where a charge potential difference occurs in an etching object. Here, a charge potential may mean energy in plasma due to a density difference of conductive layers. Because a density difference of conductive materials is the largest between the cell region CER and the connection region CNR, a defect 41 in which the slit SLT is bent may occur between the cell region CER and the connection region CNR. Therefore, in the first embodiment, first and second protective patterns PP1 and PP2 may be formed in a region where the defect 41 in which the slit SLT is bent occurs. The first and second protective patterns PP1 and PP2 may be formed of a conductive material or a semiconductor material capable of attracting a charge during an etching process. For example, the first and second protective patterns PP1 and PP2 may be formed of polysilicon. The first and second protective patterns PP1 and PP2 may be formed in a circular, elliptical, or quadrangular shape, and may be formed in various other shapes.

The first and second protective patterns PP1 and PP2 may be formed between the cell region CER and the connection region CNR in a step of forming the cell plugs CP, and may be removed after the etching process for forming the slit SLT is performed.

In the first embodiment, the first protective pattern PP1 may be formed between the cell region CER and the connection region CNR of the first memory block BLK1, and may partially overlap the slit SLT. The second protective pattern PP2 may be formed between the cell region CER and the connection region CNR of the second memory blocks BLK2, and may partially overlap the slit SLT. The first and second protective patterns PP1 and PP2 are formed to face each other between the first and second memory blocks BLK1 and BLK2 but are formed so as not to contact each other.

Figure 5:
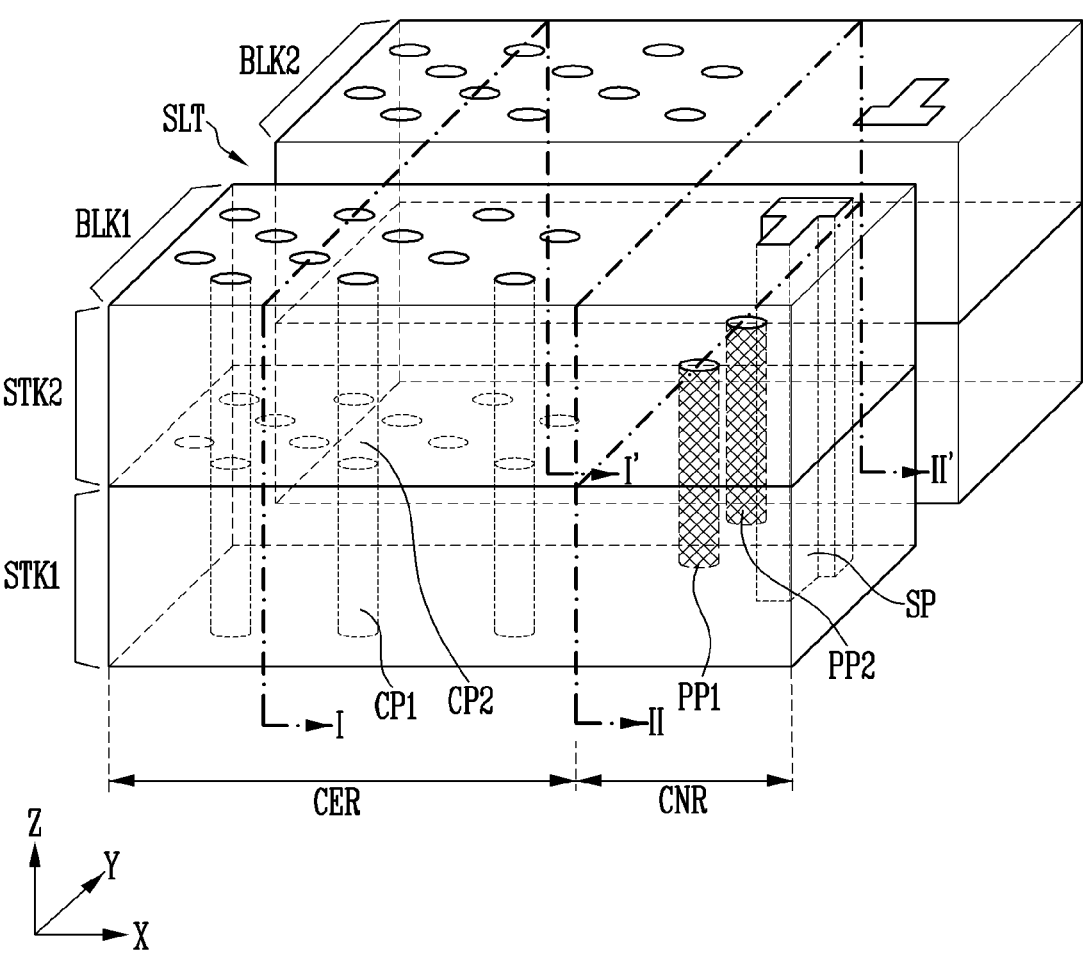
FIG. 5 is a diagram illustrating a memory device having a multi-stack structure.

FIG. 5 is a diagram illustrating a memory device having a multi-stack structure.

Referring to FIG. 5, the memory device may include memory blocks in which two or more multi-stack structures are stacked. For example, each of the first and second memory blocks BLK1 and BLK2 may include stacked first and second stack structures STK1 and STK2. Describing the first memory block BLK1 as an example, the second stack structure STK2 may be stacked on the first stack structure STK1. In the first memory block BLK1, the first and second stack structures STK1 and STK2 may include first and second cell plugs CP1 and CP2 extending in a vertical direction. For example, the first cell plugs CP1 may be formed in the cell region CER of the first stack structure STK1, and the second cell plugs CP2 may be formed in the cell region CER of the second stack structure STK2. The first protective pattern PP1 may be formed between the cell region CER and the connection region CNR of the first memory block BLK1. The first protective pattern PP1 may be formed to overlap the slit SLT in the first stack structure STK1 and is not formed in the second stack structure STK2. That is, because a depth of the slits SLT of the multi-stack structure is deeper than that of a slit SLT of a single stack structure, a defect is more likely to occur in the multi-stack structure than in the single stack structure.

Also, in the second memory block BLK2, the second protective pattern PP2 may be formed in the first stack structure STK1, and is not formed in the second stack structure STK2.

A method of manufacturing the memory device according to the first embodiment is described with reference to cross-sections I-I' and II-II'.

FIGS. 6A to 6J are diagrams illustrating the method of manufacturing the memory device according to the first embodiment of the present disclosure.

Figure 6A:
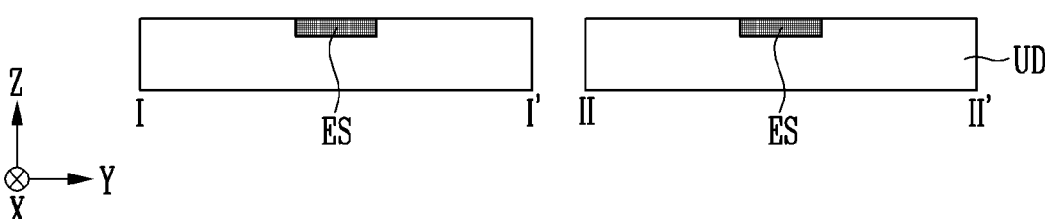

Referring to FIGS. 5 and 6A, an etch stop pattern ES may be formed in a region where the slit SLT is to be formed in a lower structure UD. The lower structure UD may be a source line structure. The etch stop pattern ES may be used as a stop layer for preventing over-etching during a subsequent etching process for forming the slit. The etch stop pattern ES may be formed of a conductive material such as tungsten. The etch stop pattern ES may be formed in a line shape extending from the cell region CER to the connection region CNR.

Figure 6B:
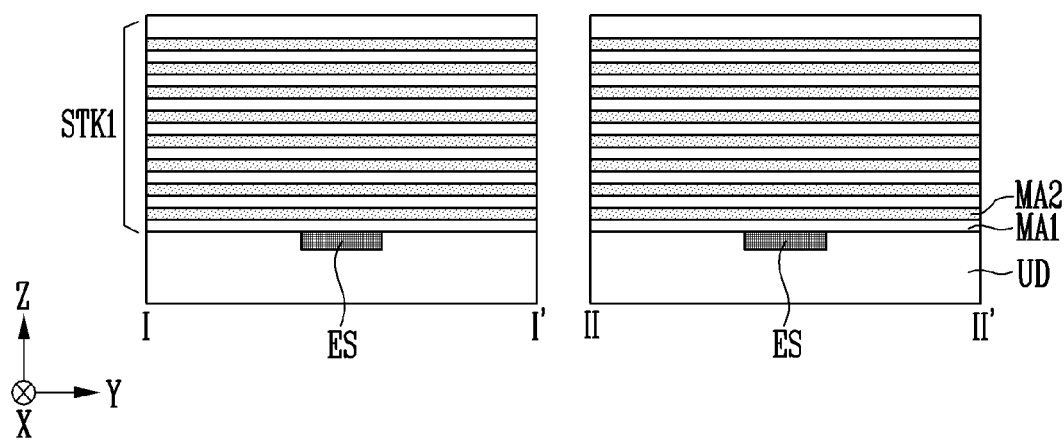

Referring to FIGS. 5 and 6B, the first stack structure STK1 may be formed on the lower structure UD including the etch stop pattern ES. The first stack structure STK1 may include first and second material layers MA1 and MA2 that are alternately stacked. The first material layers MA1 may be oxide layers, and the second material layers MA2 may be sacrificial layers to be removed in a subsequent process. For example, the second material layers MA2 may be nitride layers. The first material layers MA1 may be used as a material that insulates between gate lines in a subsequent process.

Figure 6C:
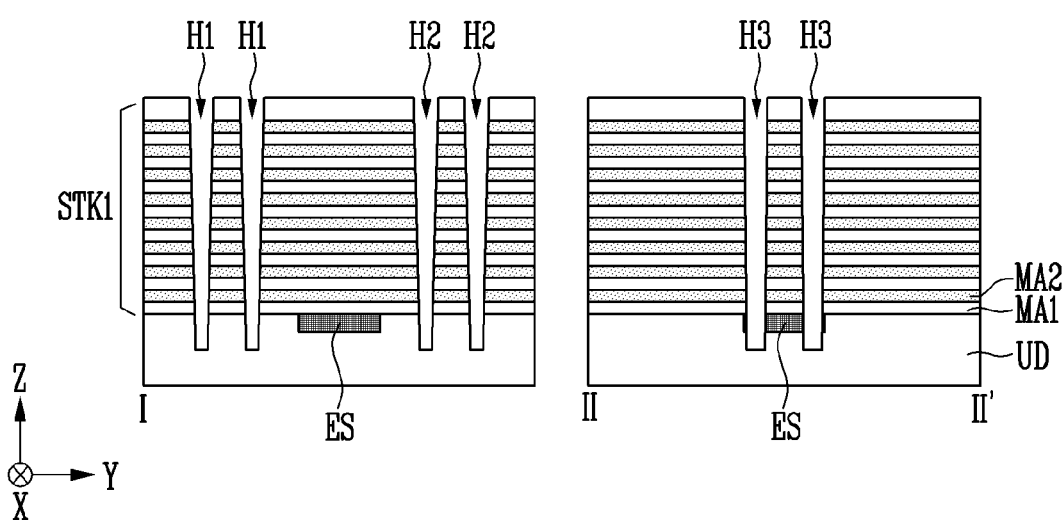

Referring to FIGS. 5 and 6C, the first to third vertical holes H1 to H3 vertically passing through the first stack structure STK1 may be formed. The first vertical holes H1 may be formed in a first memory block region, the second vertical holes H2 may be formed in a second memory block region, and the third vertical holes H3 may be formed between the first memory block region and the slit region and between the second memory block region and the slit region. The first and second vertical holes H1 and H2 may be formed in a region spaced apart from the etch stop pattern ES, and the third vertical holes H3 may be formed in a region overlapping the etch stop pattern ES. An etching process for forming the first to third vertical holes H1 to H3 may be performed until a portion of the lower structure UD is exposed.

Figure 6D:
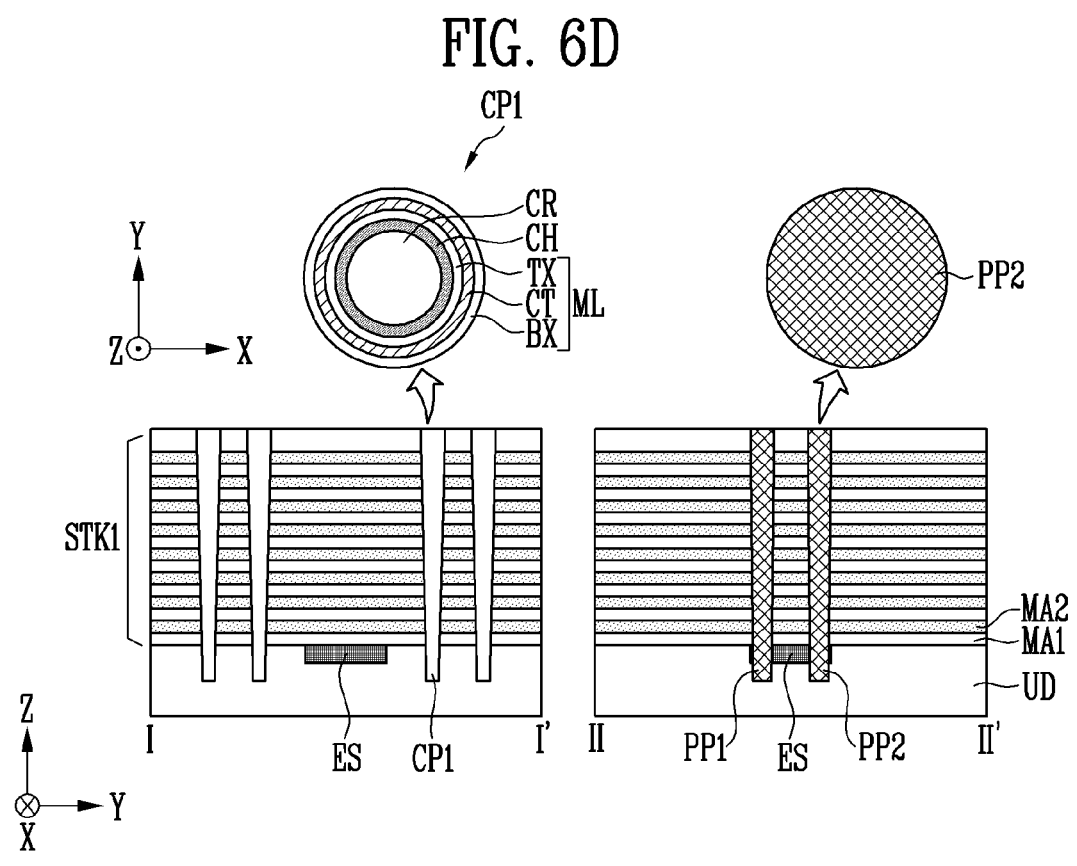

Referring to FIGS. 5 and 6D, the first cell plugs CP1 may be formed in the first and second vertical holes H1 and H2 of FIG. 6C, and the first and second protective patterns PP1 and PP2 may be formed in the third vertical holes H3 of FIG. 6C. Each of the first cell plugs CP1 may include the memory layer ML, the channel layer CH, and the core pillar CR. The blocking layer BX may be formed in a cylindrical shape passing through the first stack structure STK1 and may be formed of an oxide layer or a silicon oxide layer. The charge trap layer CT may be formed in a cylindrical shape along an inner wall of the blocking layer BX and may be formed of a nitride layer. The tunnel insulating layer TX may be formed in a cylindrical shape along an inner wall of the charge trap layer CT and may be formed of an oxide layer or a silicon oxide layer. The channel layer CH may be formed in a cylindrical shape along an inner wall of the tunnel insulating layer TX and may be formed of conductive polysilicon. The core pillar CR may be formed in a cylindrical shape filling an inside of the channel layer CH and may be formed of an insulating material such as an oxide layer or a silicon oxide layer.

The first and second protective patterns PP1 and PP2 may be formed of a conductive material or a semiconductor material capable of attracting a charge during a subsequent etching process. For example, the first and second protective patterns PP1 and PP2 may be formed of polysilicon. The first and second protective patterns PP1 and PP2 may be formed in a cylindrical shape but may also be formed in various other shapes of pillars.

Figure 6E:
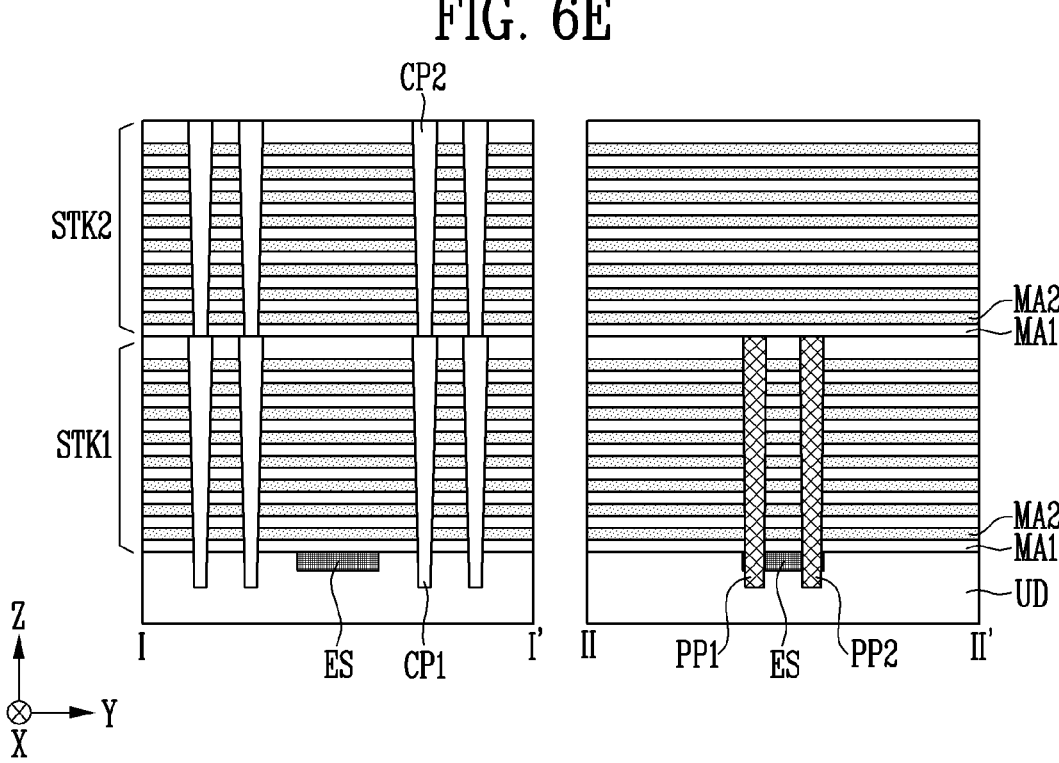

Referring to FIGS. 5 and 6E, the second stack structure STK2 may be formed on the first stack structure STK1. The second stack structure STK2 may be formed to have the same structure as the first stack structure STK1. For example, the second stack structure STK2 may include first and second material layers MA1 and MA2 that are alternately stacked with each other. Subsequently, the second cell plugs CP2 may be formed in the cell region CER of the second stack structure STK2. The second cell plugs CP2 may be formed to have the same structure as the first cell plugs CP1. Channel layers may be connected to each other in the first and second cell plugs CP1 and CP2 stacked in the vertical direction. Protective patterns are not formed in the second stack structure STK2.

Figures 6F, 6G:
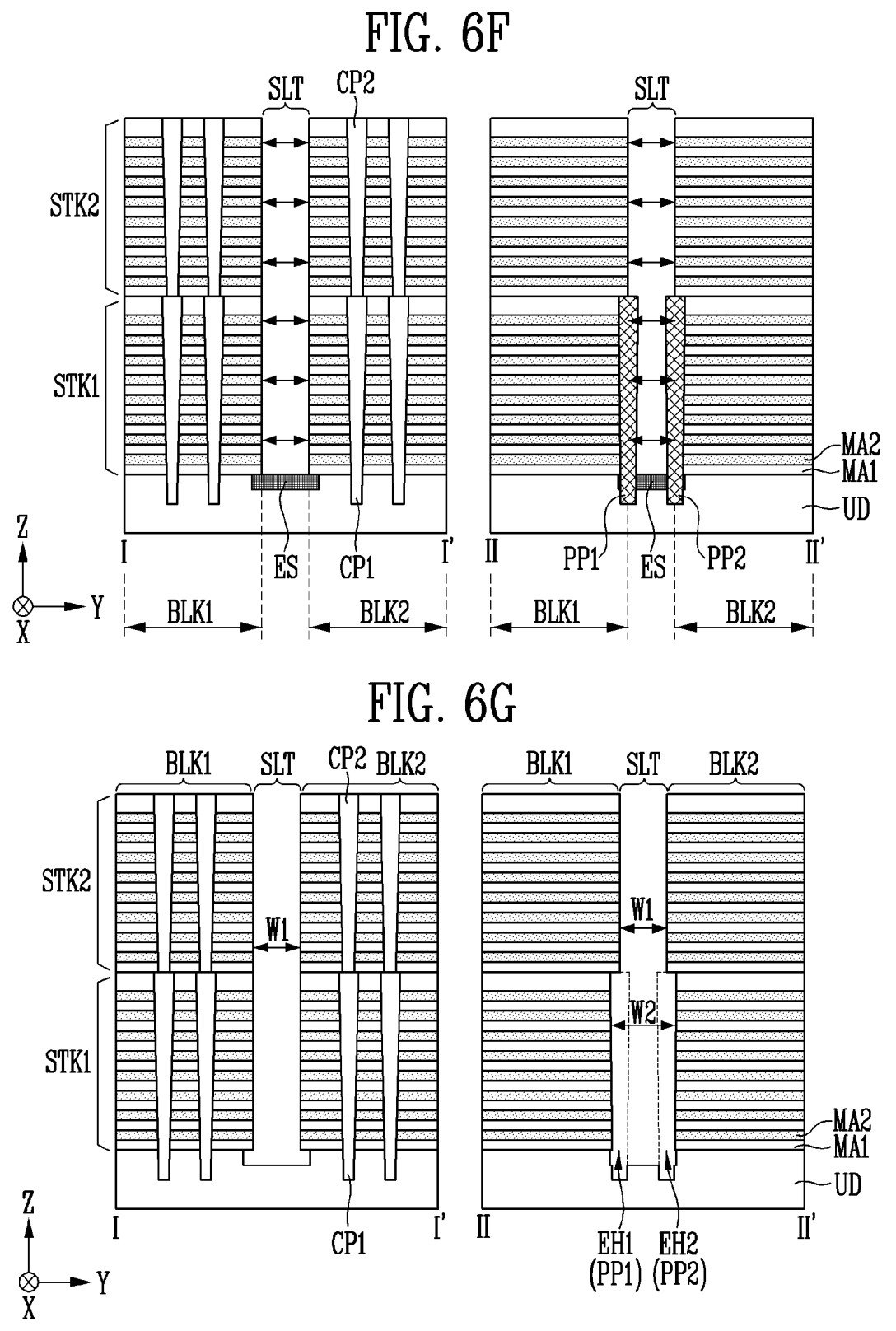

Referring to FIGS. 5 and 6F, the slit SLT for separating the first and second memory blocks BLK1 and BLK2 may be formed. A dry etching process may be performed to form the slit SLT. More specifically, the etching process may be performed as an anisotropic dry etching process. For example, after forming an etch mask pattern in which a slit SLT region is exposed on the second stack structure STK2, the second and first material layers MA2 and MA1 exposed through an opening of the etch mask pattern may be etched. The etching process may be performed using an etching gas for which a selectivity for the first and second material layers MA1 and MA2 is higher than that of the etch stop pattern ES. Therefore, the first and second protective patterns PP1 and PP2 formed of a material similar to that of the etch stop pattern ES may remain during the etching process for forming the slit SLT.

The etching process for forming the slit SLT may be performed as a dry etching process, and the dry etching process may be performed in a plasma environment. Therefore, an etching pattern may be deformed in a portion where a charge potential difference occurs, but in the present embodiment, because the first and second protective patterns PP1 and PP2 are formed in a region where a charge potential may occur, a defect in which the slit SLT is bent may be prevented from occurring.

Referring to FIGS. 5 and 6G, the first and second protective patterns PP1 and PP2 exposed through the slit SLT may be removed. During an etching process for removing the first and second protective patterns PP1 and PP2 of FIG. 6F, the etch stop pattern ES may also be removed simultaneously. For example, a wet etching process or a cleaning process using an etchant for which a selectivity for the first and second protective patterns PP1 and PP2 and the etch stop pattern ES is higher than that of the first and second material layers MA1 and MA2 may be performed to remove the first and second protective patterns PP1 and PP2 of FIG. 6F and the etch stop pattern ES. A first expansion hole EH1 may be formed in a region from which the first protective pattern PP1 is removed, and a second expansion hole EH2 may be formed in a region from which the second protective pattern PP2 is removed. The first expansion hole EH1 may be formed between the first stack structure STK1 of the first memory block BLK1 and the slit SLT, and the second expansion hole EH2 may be formed between the first stack structure STK1 of the second memory block BLK2 and the slit SLT. Therefore, a difference may occur in an upper width and a lower width of the slit SLT between the cell region CER and the connection region CNR. For example, assuming that a width of the slit SLT between the first and second memory blocks BLK1 and BLK2 in the second stack structure STK2 is a first width W1, a width of the slit SLT between the first and second memory blocks BLK1 and BLK2 may have a second width W2 wider than the first width W1 in the first stack structure STK1. The slit SLT formed in the cell region CER may have the first width W1 regardless of the first and second stack structures STK1 and STK2.

Figure 6H:
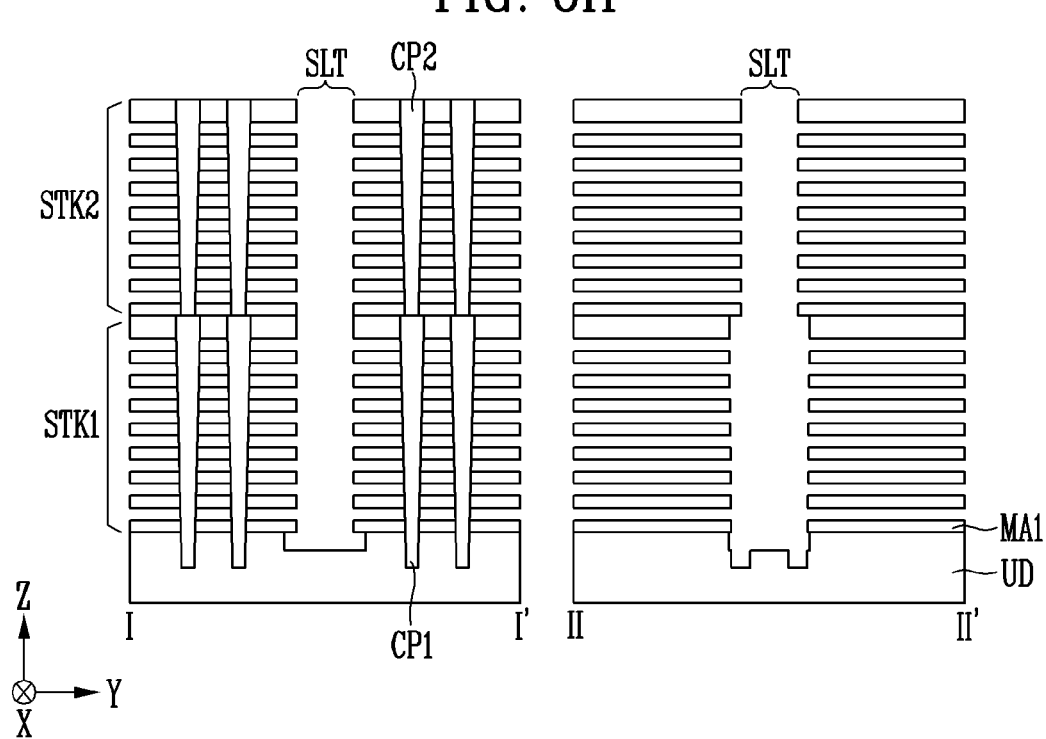

Referring to FIGS. 5 and 6H, a cleaning process for removing the second material layers MA2 exposed through the slit SLT may be performed. The cleaning process may be performed as a wet cleaning process using an etchant of which a selectivity for the second material layer MA2 is higher than that of the first material layer MA1.

Figure 6I:
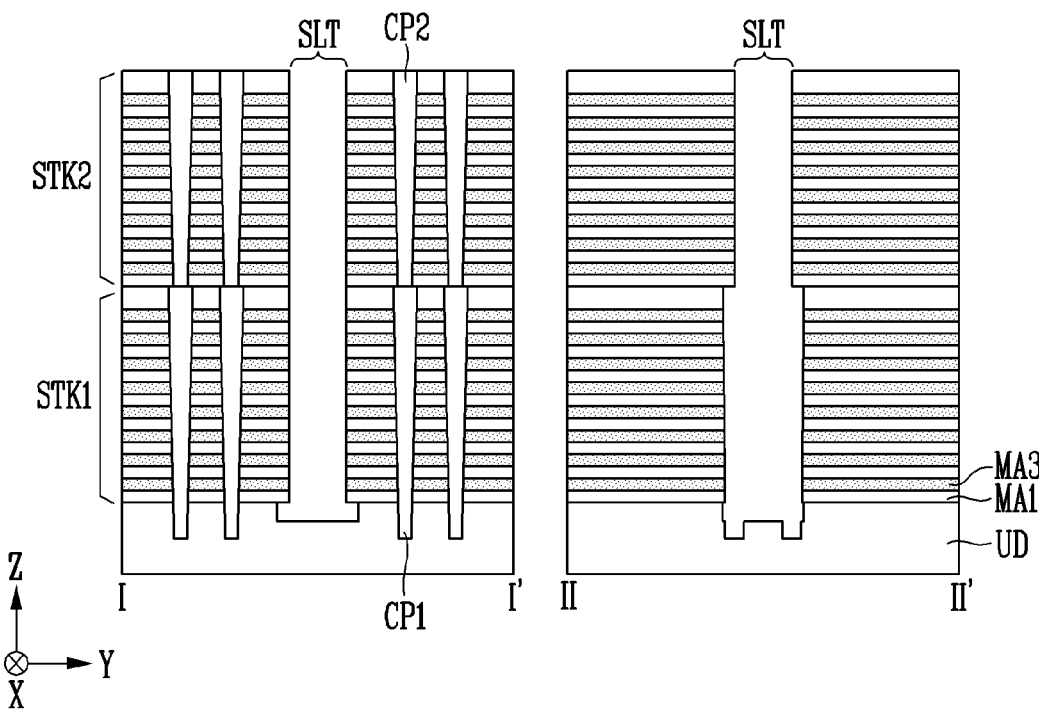

Referring to FIGS. 5 and 6I, third material layers MA3 may be formed in a region where the second material layer MA2 of FIG. 6H is removed. The third material layers MA3 may be layers used as gate lines of the memory block, may be formed of a conductive material such as tungsten (W), molybdenum (Mo), cobalt (Co), or nickel (Ni) or may be formed of a semiconductor material such as silicon (Si) or polysilicon (Poly-Si), and may be formed of various other metal materials.

Figure 6J:
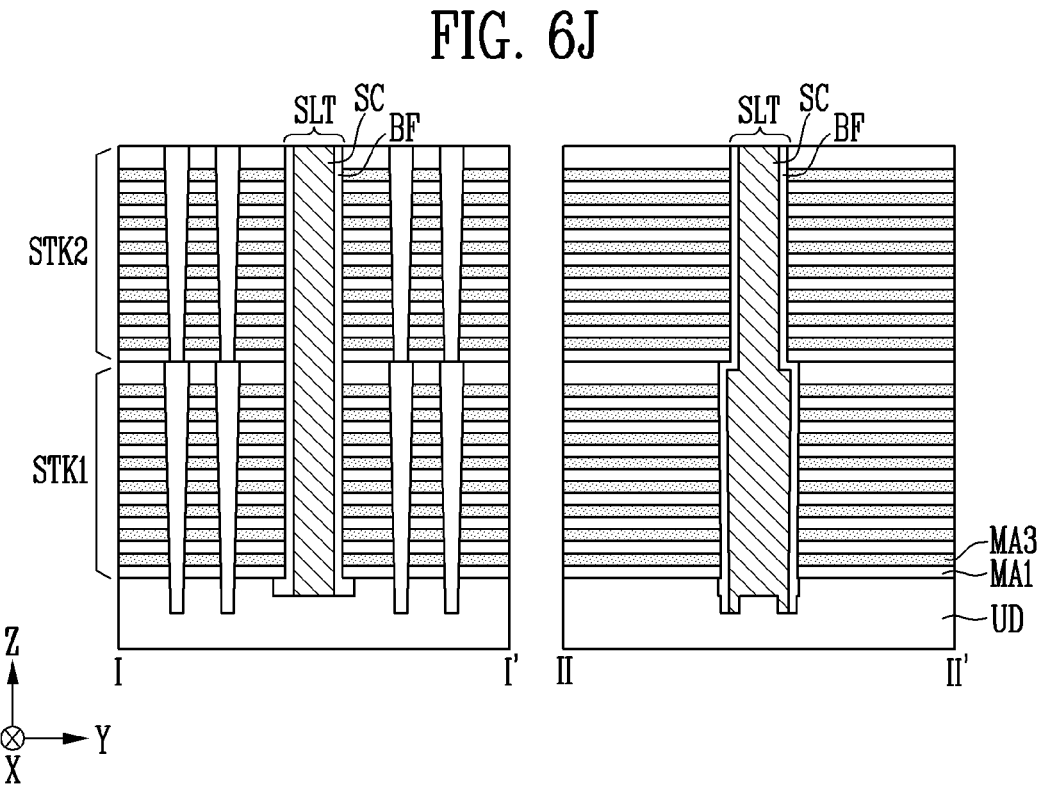

Referring to FIGS. 5 and 6J, buffer layers BF facing each other may be formed along a sidewall of the slit SLT, and a source contact SC may be formed between the buffer layers BF. The buffer layers BF may be formed of an insulating layer such as an oxide layer. The source contact SC may be formed of a conductive layer such as tungsten or polysilicon. Although not shown in the drawings, before forming the source contact SC, a source line may be formed by removing a portion of the lower structure UD and filling a region, in which the portion is removed, with a conductive material.

As described above, a phenomenon in which the slit SLT is abnormally bent may be prevented by forming the first and second protective patterns PP1 and PP2 of FIG. 6F.

Figure 7:
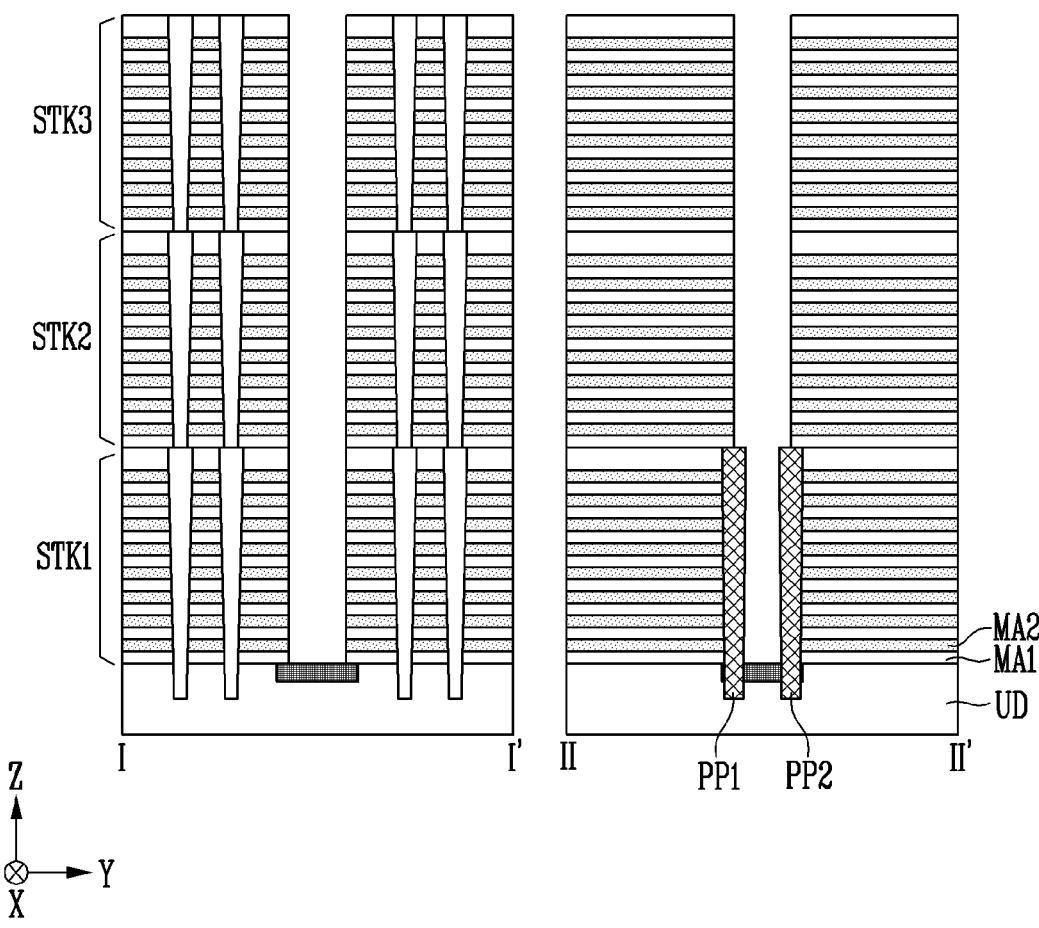
FIG. 7 is a diagram illustrating a structure of a memory device according to a second embodiment of the present disclosure.

FIG. 7 is a diagram illustrating a structure of a memory device according to a second embodiment of the present disclosure.

Referring to FIG. 7, as another embodiment of FIG. 6F of the first embodiment, in the second embodiment, a memory block may be formed of first to third stack structures STK1 to STK3. During a manufacturing process of the memory blocks, when a charge potential difference occurs in the first stack structure STK1 for which a depth is relatively deep, the first and second protective patterns PP1 and PP2 may be formed only in the first stack structure STK1 and might not be formed in the second and third stack structures STK2 and STK3.

Figure 8:
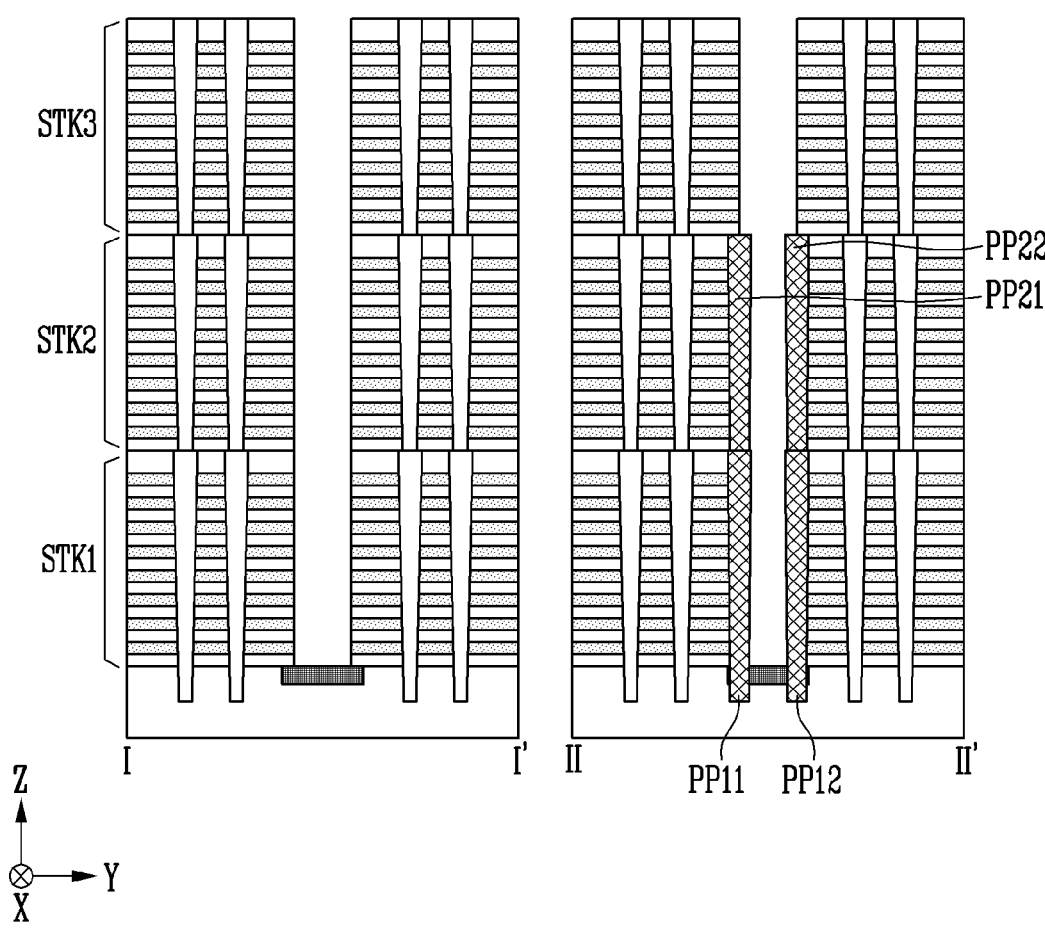
FIG. 8 is a diagram illustrating a structure of a memory device according to a third embodiment of the present disclosure.

FIG. 8 is a diagram illustrating a structure of a memory device according to a third embodiment of the present disclosure.

Referring to FIG. 8, as another embodiment of FIG. 6F of the first embodiment, in the third embodiment, the memory block may be formed of the first to third stack structures STK1 to STK3. During the manufacturing process of the memory blocks, when a charge potential difference occurs in the first and second stack structures STK1 and STK2 for which a depth is relatively deep, the first and second protective patterns PP1 and PP2 may be formed only in the first and second stack structures STK1 and STK2, and might not be formed in the third stack structure STK3. For example, an eleventh protective pattern PP11 and a twelfth protective pattern PP12 may be formed in the first stack structure STK1, and a twenty-first protective pattern PP21 and a twenty-second protective pattern PP22 may be formed in the second stack structure STK2. The twenty-first protective pattern PP21 may be formed on the eleventh protective pattern PP11, and the twenty-second protective pattern PP22 may be formed on the twelfth protective pattern PP12.

Figure 9:
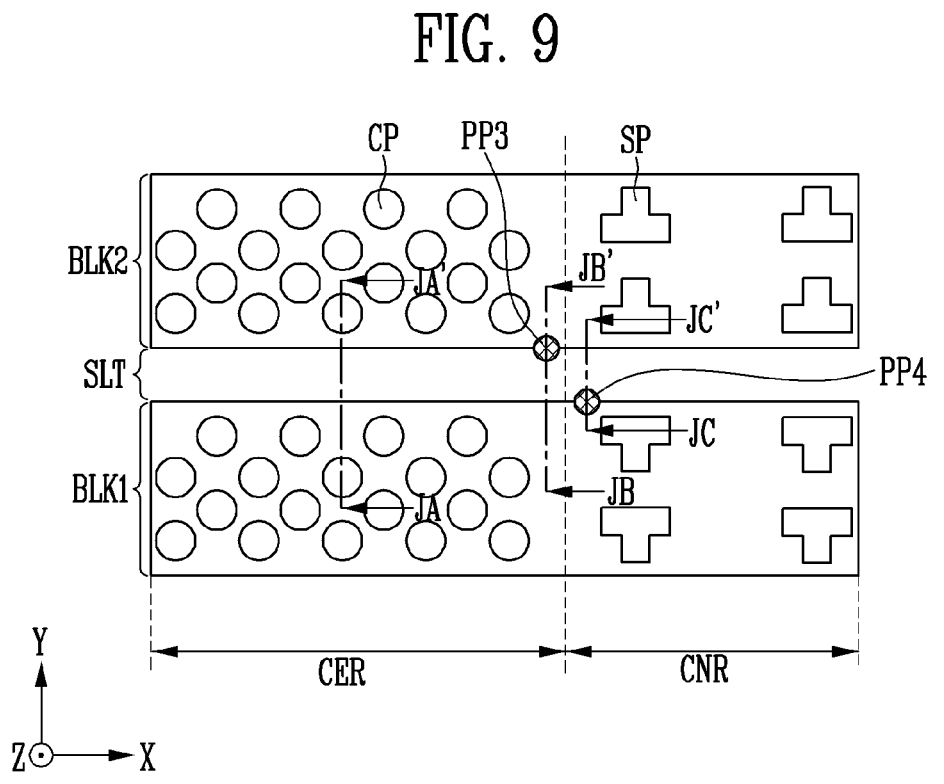

FIG. 9 is a layout illustrating a structure of a memory device according to a fourth embodiment of the present disclosure.

Referring to FIG. 9, a third protective pattern PP3 may be formed in a region adjacent to a boundary surface between the cell region CER and the connection region CNR in the cell region CER between the second memory block BLK2 and the slit SLT. A fourth protective pattern PP4 may be formed in a region adjacent to a boundary surface between the cell region CER and the connection region CNR in the connection region CNR between the first memory block BLK1 and the slit SLT. The third and fourth protective patterns PP3 and PP4 may be formed to asymmetrically face each other, as shown, based on the boundary surface between the cell region CER and the connection region CNR.

In addition to the above-described embodiments, protective patterns may be formed in various regions where a charge potential difference is relatively more likely to occur during the etching process for forming the slit SLT.

In the memory device according to the third embodiment, each of a cross-section JA-JA' of the cell region CER where the third and fourth protective patterns PP3 and PP4 do not exist, a cross-section JB-JB' of a region where the third protective pattern PP3 is formed and then removed, and a cross-section JC-JC' of a region where the fourth protective pattern PP4 is formed and then removed is described as follows.

Figure 10A:
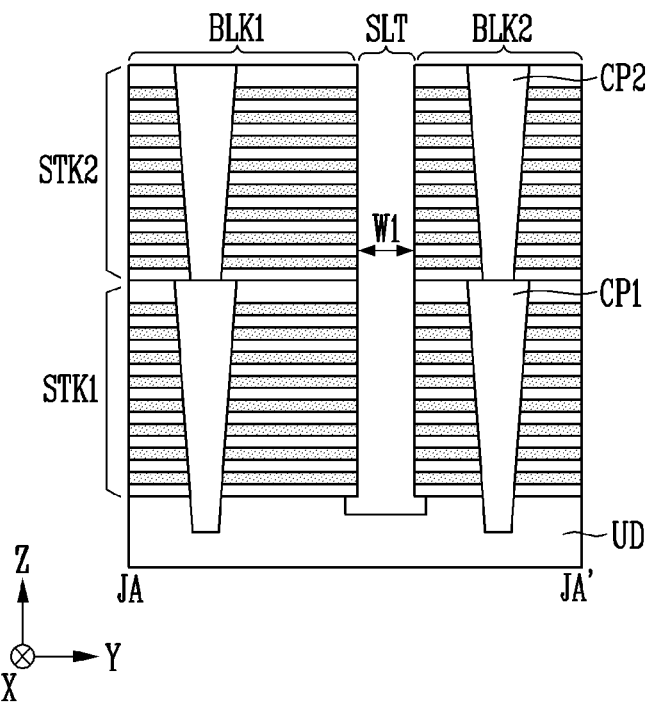
FIGS. 10A to 10C are cross-sectional views illustrating the structure of the memory device according to the fourth embodiment of the present disclosure.
Figure 10B:
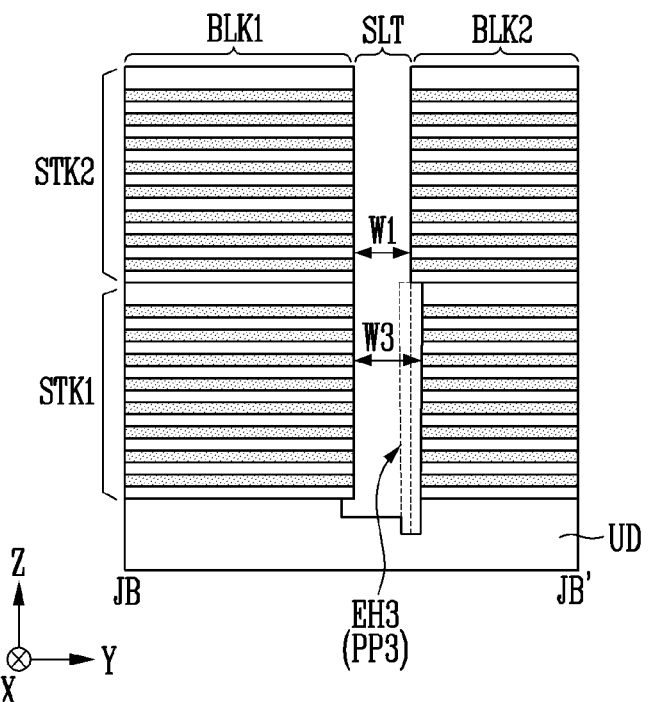
Figure 10C:
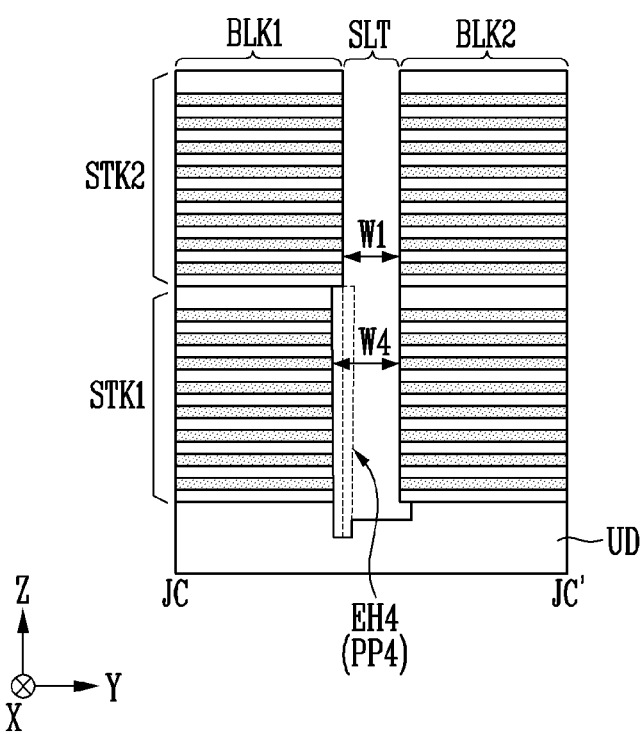

FIGS. 10A to 10C are cross-sectional views illustrating the structure of the memory device according to the fourth embodiment of the present disclosure.

Referring to FIG. 10A, the first and second stack structures STK1 and STK2 may be formed on the lower structure UD. The first and second stack structures STK1 and STK2 may be divided into the first and second memory blocks BLK1 and BLK2 by the slit SLT. For example, a portion of the first stack structure STK1 separated by the slit SLT may be included in the first memory block BLK1 and a remaining portion may be included in the second memory block BLK2. In addition, a portion of the second stack structure STK2 separated by the slit SLT may be included in the first memory block BLK1, and a remaining portion may be included in the second memory block BLK2. The first and second cell plugs CP1 and CP2 may be formed in each of the first and second memory blocks BLK1 and BLK2. The first and second cell plugs CP1 and CP2 may pass through the first and second stack structures STK1 and STK2 to contact the lower structure UD. Because a protective pattern does not exist in the cross-section taken along a JA-JA' direction, the slit SLT may have the first width W1.

Referring to FIG. 10B, because the third protective pattern PP3 overlapping the second memory block BLK2 is removed from the first stack structure STK1, a third expansion hole EH3 formed by removing the third protective pattern PP3 may overlap the first stack structure STK1 of the second memory block BLK2. Therefore, the slit SLT dividing the first stack structure STK1 into the first and second memory blocks BLK1 and BLK2 may have a third width W3 by the third expansion hole EH3. Because the third width W3 is the width of the slit SLT widened by the third expansion hole EH3, the third width W3 is wider than the first width W1 and narrower than the second width W2 of FIG. 6G.

Referring to FIG. 10C, because the fourth protective pattern PP4 overlapping the first memory block BLK1 is removed from the first stack structure STK1, a fourth expansion hole EH4 formed by removing the fourth protective pattern PP4 may overlap the first stack structure STK1 of the first memory block BLK1. Therefore, the slit SLT dividing the first stack structure STK1 into the first and second memory blocks BLK1 and BLK2 may have a fourth width W4 by the fourth expansion hole EH4. Because the fourth width W4 is the width of the slit SLT widened by the fourth expansion hole EH4, the fourth width W4 is wider than the first width W1 and narrower than the second width W2 of FIG. 6G.

According to the area where the third or fourth protective pattern PP3 or PP4 and the first stack structure STK1 overlap each other, the fourth width W4 may be equal to or different from the third width W3 of FIG. 10B.

Figure 11:
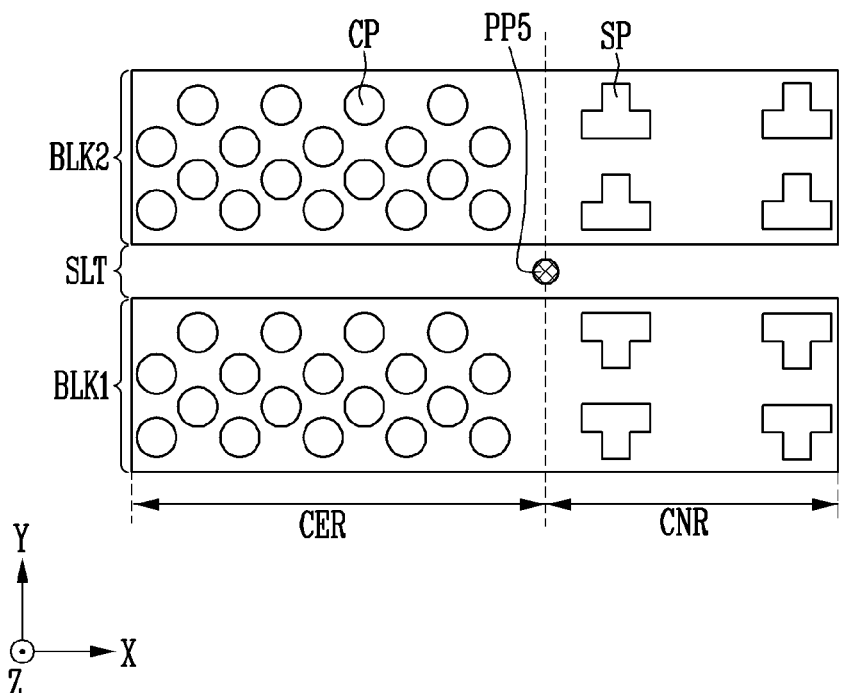
FIG. 11 is a layout illustrating a structure of a memory device according to a fifth embodiment of the present disclosure.

FIG. 11 is a layout illustrating a structure of a memory device according to a fifth embodiment of the present disclosure.

Referring to FIG. 11, in the fifth embodiment, a fifth protective pattern PP5 may be formed in the slit SLT. For example, the fifth protective pattern PP5 might not overlap the first and second memory blocks BLK1 and BLK2 and may be formed in the slit SLT between the first and second memory blocks BLK1 and BLK2. Also, in the slit SLT, the fifth protective pattern PP5 may be formed between the cell region CER and the connection region CNR, which a region where a charge potential difference is large during the etching process.

Figure 12:
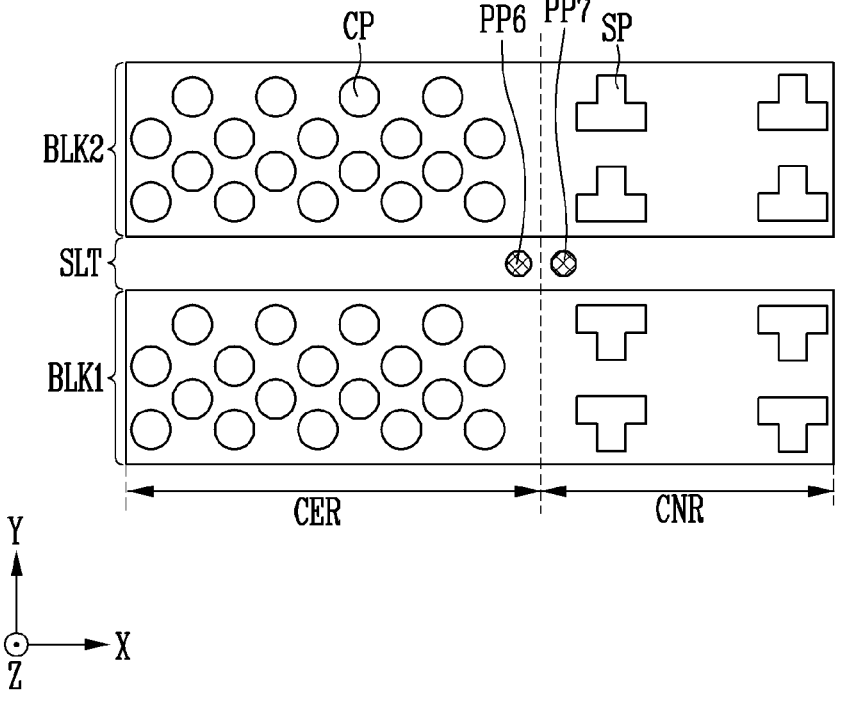
FIG. 12 is a layout illustrating a structure of a memory device according to a sixth embodiment of the present disclosure.

FIG. 12 is a layout illustrating a structure of a memory device according to a sixth embodiment of the present disclosure.

Referring to FIG. 12, sixth and seventh protective patterns PP6 and PP7 may be formed in the slit SLT. Among the sixth and seventh protective patterns PP6 and PP7, the sixth protective pattern PP6 may be formed in the slit SLT of the cell region CER, and the seventh protective pattern PP7 may be formed in the slit SLT of the connection region CNR.

Figure 13:
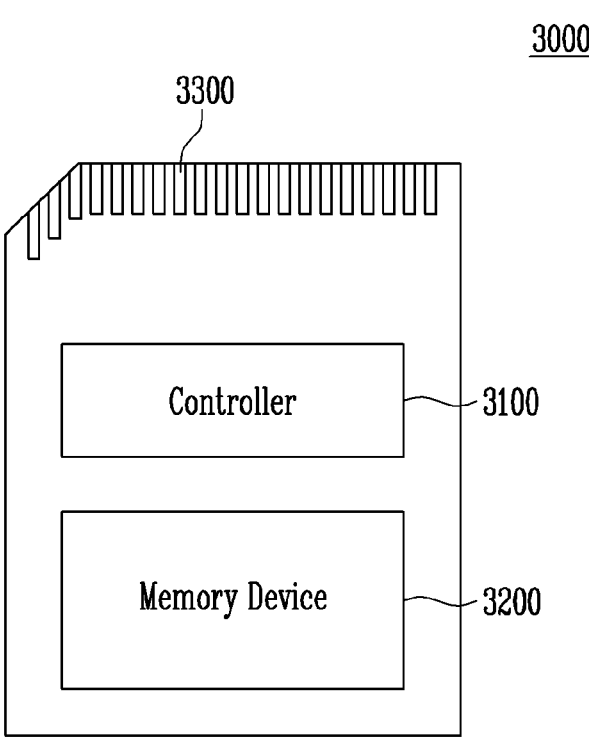
FIG. 13 is a diagram illustrating a memory card system to which a memory device of the present disclosure is applied.

FIG. 13 is a diagram illustrating a memory card system to which a memory device of the present disclosure is applied.

Referring to FIG. 13, a memory card system 3000 includes a controller 3100, a memory device 3200, and a connector 3300.

The controller 3100 is connected to the memory device 3200. The controller 3100 is configured to access the memory device 3200. For example, the controller 3100 may be configured to control a program, read, or erase operation of the memory device 3200 or to control a background operation. The controller 3100 is configured to provide an interface between the memory device 3200 and a host. The controller 3100 is configured to drive firmware for controlling the memory device 3200. For example, the controller 3100 may include components such as random access memory (RAM), a processing unit, a host interface, a memory interface, and an error correction circuit.

The controller 3100 may communicate with an external device through the connector 3300. The controller 3100 may communicate with an external device (for example, the host) according to a specific communication standard. For example, the controller 3100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 3300 may be defined by at least one of the various communication standards described above.

The memory device 3200 may include a plurality of memory cells, and may be configured identically to the memory device 100 shown in FIG. 1.

The controller 3100 and the memory device 3200 may be integrated into one semiconductor device to configure a memory card. For example, the controller 3100 and the memory device 3200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
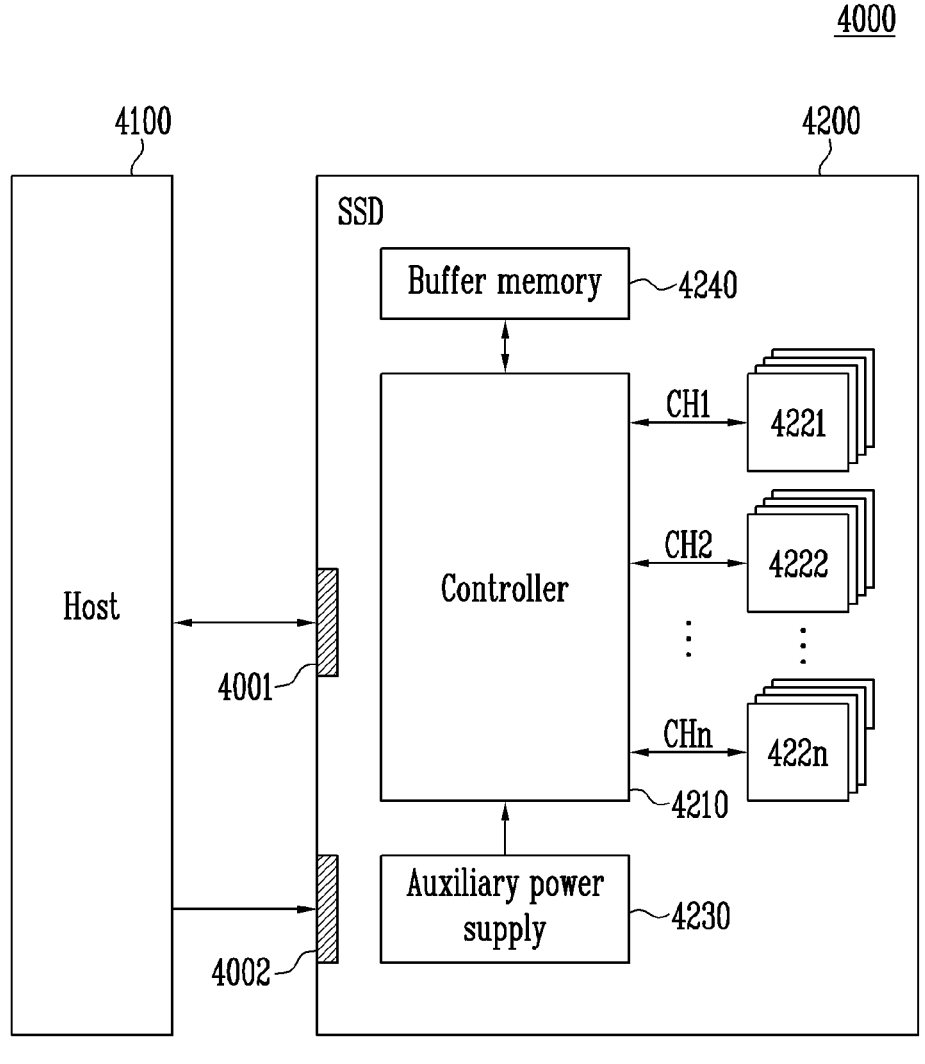
FIG. 14 is a diagram illustrating a solid-state drive (SSD) system to which a memory device of the present disclosure is applied.

FIG. 14 is a diagram illustrating a solid-state drive (SSD) system to which a memory device of the present disclosure is applied.

Referring to FIG. 14, an SSD system 4000 includes a host 4100 and an SSD 4200. The SSD 4200 exchanges a signal with the host 4100 through a signal connector 4001 and receives power through a power connector 4002. The SSD 4200 includes a controller 4210, a plurality of memory devices 4221 to 422n, an auxiliary power supply 4230, and buffer memory 4240.

The controller 4210 may control the plurality of memory devices 4221 to 422n in response to the signal received from the host 4100. For example, the signal may be signals based on an interface between the host 4100 and the SSD 4200. For example, the signal may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The plurality of memory devices 4221 to 422n may include a plurality of memory cells configured to store data. Each of the plurality of memory devices 4221 to 422n may be configured identically to the memory device 100 shown in FIG. 1. The plurality of memory devices 4221 to 422n may communicate with the controller 4210 through channels CH1 to CHn.

The auxiliary power supply 4230 is connected to the host 4100 through the power connector 4002. The auxiliary power supply 4230 may receive a power voltage from the host 4100 and charge the power voltage. The auxiliary power supply 4230 may provide a power voltage of the SSD 4200 when power supply from the host 4100 is not smooth. For example, the auxiliary power supply 4230 may be positioned in the SSD 4200 or may be positioned outside the SSD 4200. For example, the auxiliary power supply 4230 may be positioned on a main board and may provide auxiliary power to the SSD 4200.

The buffer memory 4240 operates as a buffer memory of the SSD 4200. For example, the buffer memory 4240 may temporarily store data received from the host 4100 or data received from the plurality of memory devices 4221 to 422n, or may temporarily store meta data (for example, a mapping table) of the memory devices 4221 to 422n. The buffer memory 4240 may include volatile memory, such as DRAM, SDRAM, DDR SDRAM, and LPDDR SDRAM, or nonvolatile memory, such as FRAM, a ReRAM, STT-MRAM, and PRAM.

What is claimed is:

1. A memory device comprising:
a first memory block in which a cell region and a connection region are disposed in a first direction;
a second memory block in which the cell region and the connection region are disposed in the first direction, the second memory block being adjacent to the first memory block in a second direction perpendicular to the first direction; and
a slit between the first and second memory blocks separating the second memory block from the first memory block,
wherein the slit has a first width between the cell region of the first memory block and the cell region of the second memory block, and the slit has the first width between the connection region of the first memory block and the connection region of the second memory block, and the slit has a second width wider than the first width in a region where the cell region and the connection region of the first memory block are adjacent to each other and the cell region and the connection region of the second memory block are adjacent to each other, wherein the slit includes:
a first expansion hole concave into the first memory block in a region between the cell region and the connection region; and
a second expansion hole concave into the second memory block in a region between the cell region and the connection region.

2. The memory device of claim 1,
wherein the slit has a linear shape except for a region where the first or second expansion hole is formed.

3. The memory device of claim 1,
wherein the first and second memory blocks include first stack structures and second stack structures stacked on the first stack structures.

4. The memory device of claim 3,
wherein a portion of the slit formed between the first stack structures has the second width, and a portion of the slit formed between the second stack structures has the first width.

5. A memory device comprising:
a first memory block in which a cell region and a connection region are disposed in a first direction;
a second memory block in which the cell region and the connection region are disposed in the first direction, the second memory block being adjacent to the first memory block in a second direction perpendicular to the first direction; and
a slit between the first and second memory blocks separating the second memory block from the first memory block,
wherein the slit has a first width between the cell region of the first memory block and the cell region of the second memory block, and the slit has the first width between the connection region of the first memory block and the connection region of the second memory block, and the slit has a second width wider than the first width in a region where the cell region and the connection region of the first memory block are adjacent to each other and the cell region and the connection region of the second memory block are adjacent to each other,
wherein the slit includes:
a first expansion hole concave into the second memory block; and
a second expansion hole concave into the first memory block.

6. The memory device of claim 5,
wherein the first expansion hole is located in the cell region adjacent to a boundary surface between the cell region and the connection region.

7. The memory device of claim 5,
wherein the second expansion hole is located in the connection region adjacent to a boundary surface between the cell region and the connection region.

8. The memory device of claim 5,
wherein the first and second memory blocks include first stack structures and second stack structures stacked on the first stack structures.

9. The memory device of claim 8,
wherein a portion of the slit formed between the first stack structures has the second width, and a portion of the slit formed between the second stack structures has the first width.

* * * * *